United States Patent [19]
Vergato

[11] 3,930,727
[45] Jan. 6, 1976

[54] AUTOMATIC VARIABLE FILTERS FOR USE IN SCANNED SPECTROMETERS AND THE LIKE

[75] Inventor: Joseph A. Vergato, Monroe, Conn.
[73] Assignee: Perkin-Elmer Corporation, Norwalk, Conn.
[22] Filed: Jan. 21, 1974
[21] Appl. No.: 435,361

Related U.S. Application Data
[62] Division of Ser. No. 283,399, Aug. 24, 1972, abandoned.

[52] U.S. Cl. .................. 356/96; 250/226; 324/128; 328/167; 356/97
[51] Int. Cl.² .......................................... G01J 3/42
[58] Field of Search .......... 356/96, 97, 98; 250/226; 324/128; 328/167

[56] References Cited
UNITED STATES PATENTS
3,409,373  11/1968  Matthews............................. 356/96

OTHER PUBLICATIONS
Audio-Spectrum Analyser; Bronzite; Electronic Engineering; Jan. 1968; pp. 27–31.

Primary Examiner—Vincent P. McGraw
Attorney, Agent, or Firm—S. A. Giarratana; F. L. Masselle; J. K. Conant

[57] ABSTRACT

A spectrometer is scanned across a desired frequency range. A selective filter is automatically varied to alter its characteristics according to the spectrometer's scanning rate by a single control voltage; to assure that the filter's characteristics are optimum for both fast and slow scanning rates.

This invention relates to spectrometers and more particularly to apparatus for enabling automatic tracking of filter characteristics during the scanning of a spectrometer.

5 Claims, 4 Drawing Figures

AUTOMATIC VARIABLE FILTERS FOR USE IN SCANNED SPECTROMETERS AND THE LIKE This is a division of U.S. Pat. application Ser. No. 283,399, filed Aug. 24, 1972, now abandoned.

BACKGROUND OF INVENTION

There presently exist instruments which are referred to as spectrometers. Such spectrometers may be utilized over a broad range of optical wave lengths to analyze different light sources. Basically, certain spectrometers have been referred to as infra-red spectrometers or IR spectrometers. These instruments may be scanning type instruments and utilize a dual beam or two channel system to provide at an output a ratio between the energy absorbed by a sample and the energy used as a reference. In this manner, one channel is designated as a sample channel while the other channel is referred to as a reference channel. A light source is broken up into two separate paths which are the sample and the reference paths. The light is broken up by typical optical techniques such as the utilization of prisms, lenses and so on. In such a system, the light from the sample channel is shined through a suitable aperture or lens assembly where it is directed to be absorbed by a sample. The sample used will absorb different wave lengths of light according to its characteristics. The output of the sample is eventually applied to monochromator after combination with the reference signal. The monochromator functions as an optical filter and passes a relatively narrow band of energy at a given wave length for a setting or position of the monochromator. In such a spectrometer, the monochromator is scanned at a given rate to allow the instrument to pass all energy at various wave lengths which are being absorbed by the sample. In such a system, the output from the monochromator is converted by an optical to electrical conversion detector assembly to convert the light signal from the monochromator into an electrical signal. The output of the device is basically a ratio which is representative of the light absorbed by the sample as compared to the reference light. The scanning of the monochromator may be synchronized with a pen recorder or other type display device. In this manner, the abscissa (x axis) is in wave length while the ordinate (y axis) is the ratio between absorbed light and the reference light, referred to as transmittance.

For example, if the sample absorbs no light, then the light or energy in the sample path is equal to the reference energy and one would develop a DC level at the recorder. On the other hand, if the sample absorbs 100 percent of the light then the output at the recorder would go towards zero. In this manner, as a sample is scanned one sees at the output of the recorder a series of peaks and valleys which are representative of the wave lengths and energy content which is being absorbed by the sample. If the system is scanned slowly, these peaks and valleys would change slowly. As one could see, the rate of change is a function of the scanning rate of the system. In order to eliminate detector noise, Johnson noise and other spurious signals, one would utilize a low pass filter with a relatively narrow band for a low scanning rate. The low pass filter required due to the fact that the output could be DC if there was no absorption by the sample. The band width of the filter is determined by the scanning rate and the slower the scanning the narrower the band width. This, of course, is to eliminate noise in order to obtain good resolution. It is, of course, known that such noise is broad band and is present at all frequencies. An inherent difficulty with low scanning rates is that it takes greater time to analyze a given sample.

One could, therefore, desire to increase the scanning rate in order to perform more rapid analysis. However, a rapid scanning rate requires greater band width filters as the energy level changes more rapidly. If the band width of the filter was widened arbitrarily, or by a fixed number of cycles, one begins to pass more noise. The additional noise would adversely affect the resolution of the instrument. Therefore, one would desire to change the band width of the filter for increasing scanning rates but the change has to be optimum so that a minimum amount of noise would propagate through at a given scanning rate.

The prior art contemplated a manual selection of filter characteristics. These were selected by the operator for a change in the scan rate. For example, if the selective filter network consisted of a three pole arrangement, one would conventionally require three capacitors and five resistors. To effectuate a time constant change, either all the capacitors or all the resistors would have to be changed. To obtain twelve different time constants, as in a typical spectrometer, one would therefore require switching between 60 resistors and 36 capacitors. Such a switching arrangement is, of course, both expensive and bulky and further requires continuous adjustment and selection by the operator of the analyzer.

It would therefore be desirable to provide an improved filter arrangement for use with a scanning spectrometer wherein the filter characteristics are continuously and automatically varied according to the scanning rate.

BRIEF DESCRIPTION OF PREFERRED EMBODIMENT

A spectrometer or similar apparatus of the type for determining the frequencies or wave lengths and the energy at these wave lengths as contained in an unknown signal source includes scanning means operative to scan said source at a desired rate and over a predetermined range of frequencies, in combination with such apparatus there is provided a variable filter having an input terminal adapted to receive said unknown signal and a control terminal operative upon application of a control voltage thereto to vary said filter characteristics, control means responsive to the rate of said scan provide a control voltage proportional to said rate, which voltage is applied to said control terminal of said filter means to vary said characteristics according to the rate of scan.

DETAILED DESCRIPTION OF FIGURES

Figure 1:
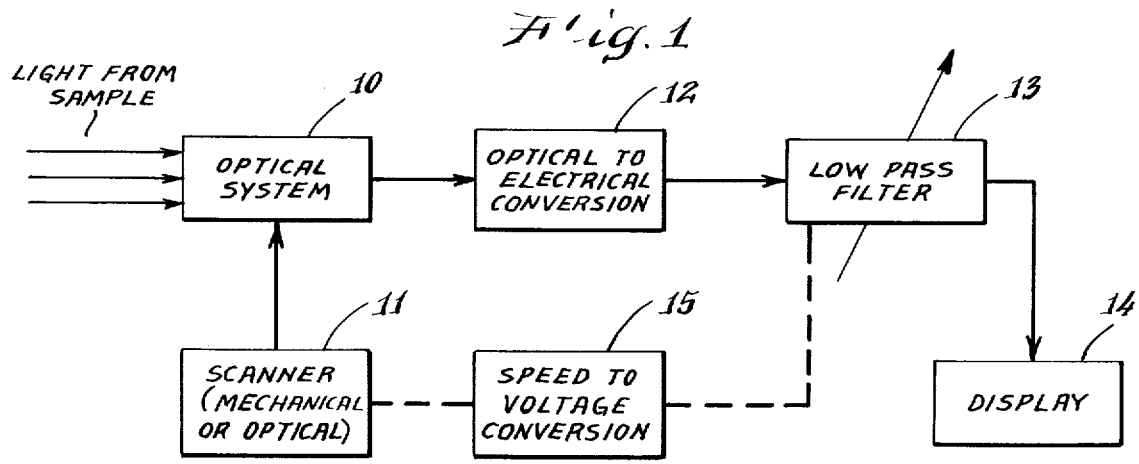
FIG. 1 is a block diagram of a scanning spectrometer having a variable filter controlled according to the the invention.

Referring to FIG. 1, there is shown a block diagram of a spectrometer, which can be of the type generally described in the Background of the Invention.

Light from an unknown source is directed via a suitable lens or otherwise to an optical system 10. The light may be that given off by a flame due to the selective burning of a chemical in an oven and so on. The sample, as indicated, would emit one or more wavelengths of light, depending upon the chemical content of the ignited specimen. As is known, each spectral color corresponds to a particular wavelength of light. The spectrum of an incandescent solid or liquid or a compressed gas is continuous and contains all spectrum colors from red to violet. In any event, the colors which are analogous to discrete frequencies enable one to analyze the contents of a specimen by use of the spectrometer as indicated above.

The light as directed to the optical system 10 is caused to propagate through a series of lenses and prisms where it is broken up into respective components and directed along two paths. The optical system 10 is scanned by means of an optical or mechanical scanner 11. The function of the scanner 11 is to control the optical system such that energy from the source is scanned over a predetermined range of frequencies, so that each component as contained in the light emitted and thence absorbed by the sample can be isolated and separated from the unknown signal.

The scanner 11 causes the optical system 10 to commence operation at one frequency or wavelength of the spectrum towards another frequency or wavelength. The optical energy is eventually applied to an optical to electrical conversion module or detector 12 where the optical energy is converted to electrical energy for further processing and for an eventual display of the frequency constituents of the light sample.

There are a plurality of devices which convert optical energy into electrical energy. Many such devices are semi-conductors elements and are generally referred to as opto-electrical semi-conductors. Basically, such devices include photo-conductors and photovoltaic devices. Photo-conductors include a variety of different devices which are cadmium sulfide, cadmium selenide and lead sulfide, each having different spectral responses and therefore responsive to different frequencies. These devices can be fabricated so that their spectral response can be altered by changing the doping and so on. For an example of many different photo-sensitive devices, reference is made to an article entitled "SPOTLIGHT ON SEMICONDUCTOR OPTO-ELECTRONICS" by Saul A. Ritterman, published in EDN on February, 1967, pages 90 to 105.

The conversion of the optical signal into a related electrical signal is accommodated by module 12 having its output coupled to a low pass filter 13.

Filter 13 is a variable filter and is used to selectively respond to the frequencies contained in the converted signal to separate out the desired components from the interfering energy components, such as those due to noise and so on.

As indicated, the low pass filter 13 has to be varied to accommodate the scanning of the optical system 10 and according to the rate of scan. If filter 13 were unduly broad, it would be propagate all spurious frequencies due to noise as contained in the signal. Hence during the scanning process, the operator must adjust the characteristics of filter 13 according to the scan rate being accommodated at that particular time.

As previously indicated, this is done in the prior art by a mechanical or other switching technique and one has to provide a plurality of different filter arrangements and elements which are switched by the operator as a function of the frequency scanned and the rate of scanning.

Shown in FIG. 1 is a speed to voltage converter module 15. The function of module 15 is to convert the speed or rate of the scanner into a voltage or current signal, which signal is coupled to the narrow band filter 13.

For example, if the scanner uses a motor, one could use a typical photocell arrangement for speed detection. In this manner, the shaft of the motor has a light reflecting spot located thereon and a source of light illuminating the shaft will be reflected by the spot and sensed by a photocell to produce pulses related to speed. These pulses can be rectified and converted to a DC level. Magnetic pickups and other devices can be used as well. The output from converter 15 is applied to the filter 13 and as will be explained is used to control the characteristics or time constant of the filter 13 according to the speed as detected by the module 15.

Figure 2:
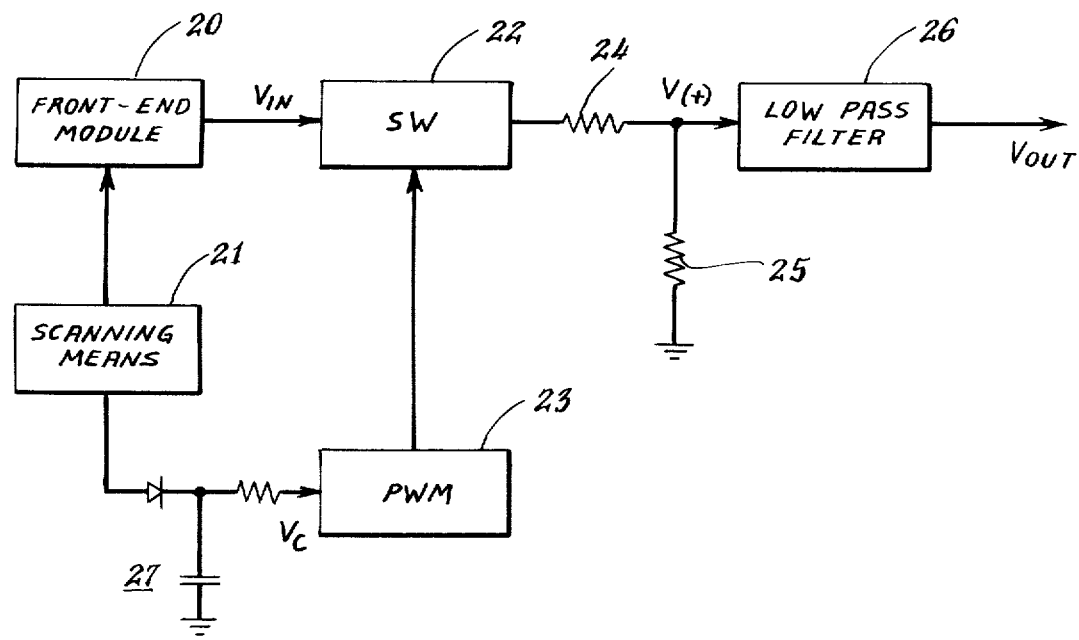
FIG. 2 is a block diagram of a test instrument useful in explaining the operation of the invention.

Referring to FIG. 2 there is shown a module 20 generally referenced as a front end module. As such, module 20 may be the front or head end of a spectrometer, monochromator or a spectrum analyzer. The function of module 20 being to receive a complex signal from a light or frequency source within a given bandwidth. The front end is scanned across a predesired range of frequencies by means of scanner means 21. As indicated, the scanning means 21 may be mechanical, electrical or optical and serves to control the front end 20 to cause the same to "sweep" across a desired band in order to accommodate a wide range of frequencies.

Coupled to the output of the front end module is a switch 22. Another input of the switch 22 is coupled to a pulse width modulator circuit 23 (PWM). The function of the pulse width modulator 23 is to provide at an output a pulse train, whose pulse width varies as a function of a control voltage Vc applied to an input terminal.

The control voltage Vc is directly related to the scanning rate. As the scanning rate changes, the time constant of the filter 26 must change to keep the time constant at an optimum value so the filter 26 can accommodate the desired frequencies without excessive interference due to noise.

There is shown a half wave rectifier configuration 27 coupled between the scanning means 21 and the PWM 23, for developing the control voltage Vc. This is only by way of example and other circuit configurations as indicated above could be used as well. The rectifier 27 would provide a DC voltage (Vc) related to the speed or rate of the scanning means. In any event, speed to voltage or current convertors are well known in the art and not considered to be part of this invention.

In this manner, the switch 22 has an output coupled to a voltage divider comprising resistors 24 and 25, which resistors are part of the time constant network of the filter 26. The junction between resistors 24 and 25 is coupled to the input of the filter 26, whose output (V out) accommodates the frequencies included in the unknown input signal source.

Essentially the control arrangement for the filter time constant can be designated as a resistance multiplication technique.

The switch 22 appears in series with an equivalent resistance represented by resistors 24 and 25. The effective resistance of the filter, which determines the time constant, is multiplied by a factor N. The factor N is equal to the switching period T divided by the on period (T on), hence:

$$N = \frac{T}{T_{o}N} \quad (1)$$

With this arrangement, equivalent resistors in the range of R to hundreds of times R can be obtained. Referring to FIG. 2 assume that $$V_{out} = \frac{1}{T}\int_0^n V(t)dt$$

where:
V out = voltage of filter
T = switching period
V(t) = input voltage to filter
then:

$$V_{out} = \frac{1}{T}\int_0^{T_{on}} \frac{V_{in}R25}{R24 + R25} dt$$

where:
Ton = on period of the switch
Vin = instantaneous input voltage
and $$\frac{N_o}{V_{in}} = \frac{T_{on}}{T} \cdot \frac{R25}{R24 + R25} = V_c \cdot \frac{KR25}{T(R24 + R25)}$$

K = integration constant
Vc = control voltage to modulator

From the above relations, it can be seen that the switching times Ton and T determine the effective resistance of the network and hence the effective time constant. If the switch were continuously on, then the effective resistance would be equal to the parallel combination of R24 and R25. If the switch were continuously off, the effective resistance would be infinity. For intermediate values of on and off times the effective resistance is between the two values. Since the switch 22 in actual practice can never approach infinite resistance, the upper limit of the actual resistance is finite but hundreds of times greater than the equivalent resistance determined by R24 and R25.

Figure 3:
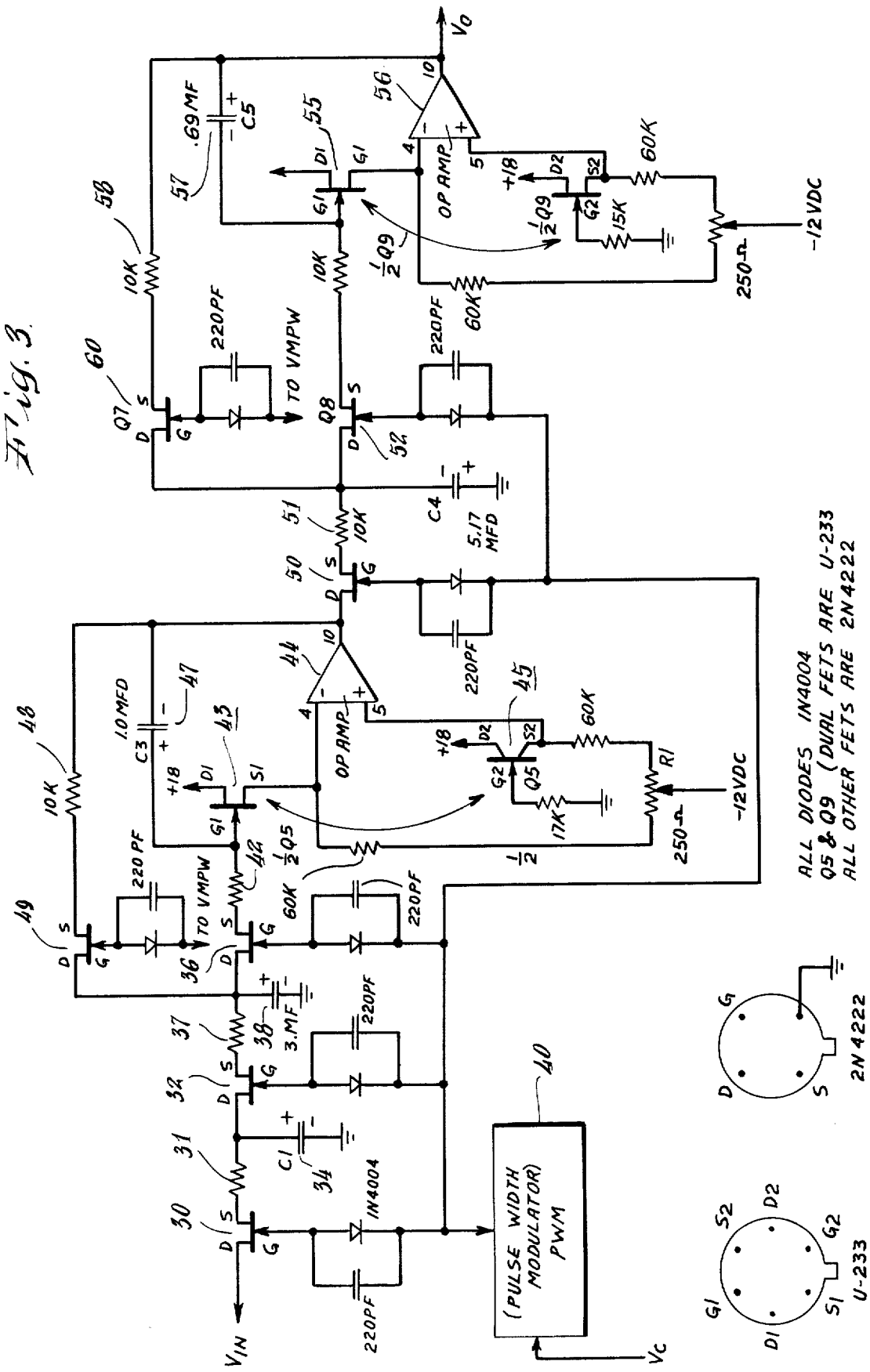
FIG. 3 is a detailed schematic diagram of a variable filter used in the invention.

Referring to FIG. 3, there is shown a detailed schematic diagram of a filter used with this invention and capable of being controlled accordingly.

The filter is essentially a Dessel type active five-pole filter including a plurality of field effect transistors which serve as switch elements for affording time constant change.

An input voltage Vin is applied to the drain (D) electrode of a first field effect transistor or FET 30. The source electrode(s) of FET 30 is coupled through a resistor 31 to the drain of a second FET 32. A capacitor 34 is coupled from the drain of FET 32 to a point of reference potential or ground, and serves as the capacitive component of the filter section. Accordingly, the source of FET 32 is likewise coupled to the drain of another FET 36, through a resistor 37. The drain of FET 36 is further AC coupled to reference potential by a filter capacitor 38. The gates of the FET's 30, 32 and 36 are respectively controlled and coupled to a pulse width modulator 40, for providing a varying width pulse according to an applied control valve Vc derived from the scanning means and according to the rate of scanning. Coupling to the gate electrodes is accomplished by a parallel diode and capacitor arrangement to protect the gate and assure proper response to the pulse modulated input.

Essentially, the FET's 30, 32 and 36 operate as variable resistances, whose value is a function of the pulse width applied to the gates via the PWM 40. The three FETs and associated resistor and capacitors form a passive filter section capable of supplying a variable time constant according to the switching rate and under control of PWM 40.

The source electrode of FET 36 is coupled via resistor 42 to the gate electrode of a source follower circuit 43. The source follower 43 serves to drive the inverting input of a high gain operational amplifier 44. Biasing for the operational amplifier 44 is supplied to the non-inverting input via a source follower, bias source 45.

The output of the operational amplifier 44 is coupled back to the input circuit via a frequency selective feedback network including capacitor 47 coupled between the output of op AMP 44 and the gate of source follower 43. A second feedback loop comprises resistor 48 in series with an FET 49, coupled between the output of the op AMP 44 and the drain of FET 36. The gate of this FET 49 is also coupled to PWM 40, for varying its resistance and hence the response of this active filter section.

Basically, the operational amplifier 44 is a gain providing device and as such forms an active filter with a time constant which can be varied by controlling FET 49.

The output of op AMP 44 is further coupled to the drain of FET 50. This FET 50 is in series with the resistor 51 and the drain to source path of still another FET 52. These FET's 50 and 52 form another passive filter section and have their gates controlled from PWM 40.

The source electrode of FET 52 is coupled to the gate of source follower 55, which drives another active filter section including op AMP 56. The op AMP 56 has its output feedback via capacitor 57, resistor 58 and FET 60, FET 60 also being controlled via its gate electrode by PWM 40.

The output of the op AMP 56 is the filtered signal to be applied to a suitable display as a recorder for deriving an energy display versus wavelength characteristic for the unknown signal.

Thus it can be seen that the filter described is capable of providing a continuous variation of time constant and therefore filtering characteristics all under control of the PWM 40.

The PWM 40 as controlled by Vc can therefore serve to vary filter characteristics according to Vc and therefore according to the scanning rate of the instrument in which this invention is used.

Figure 4:
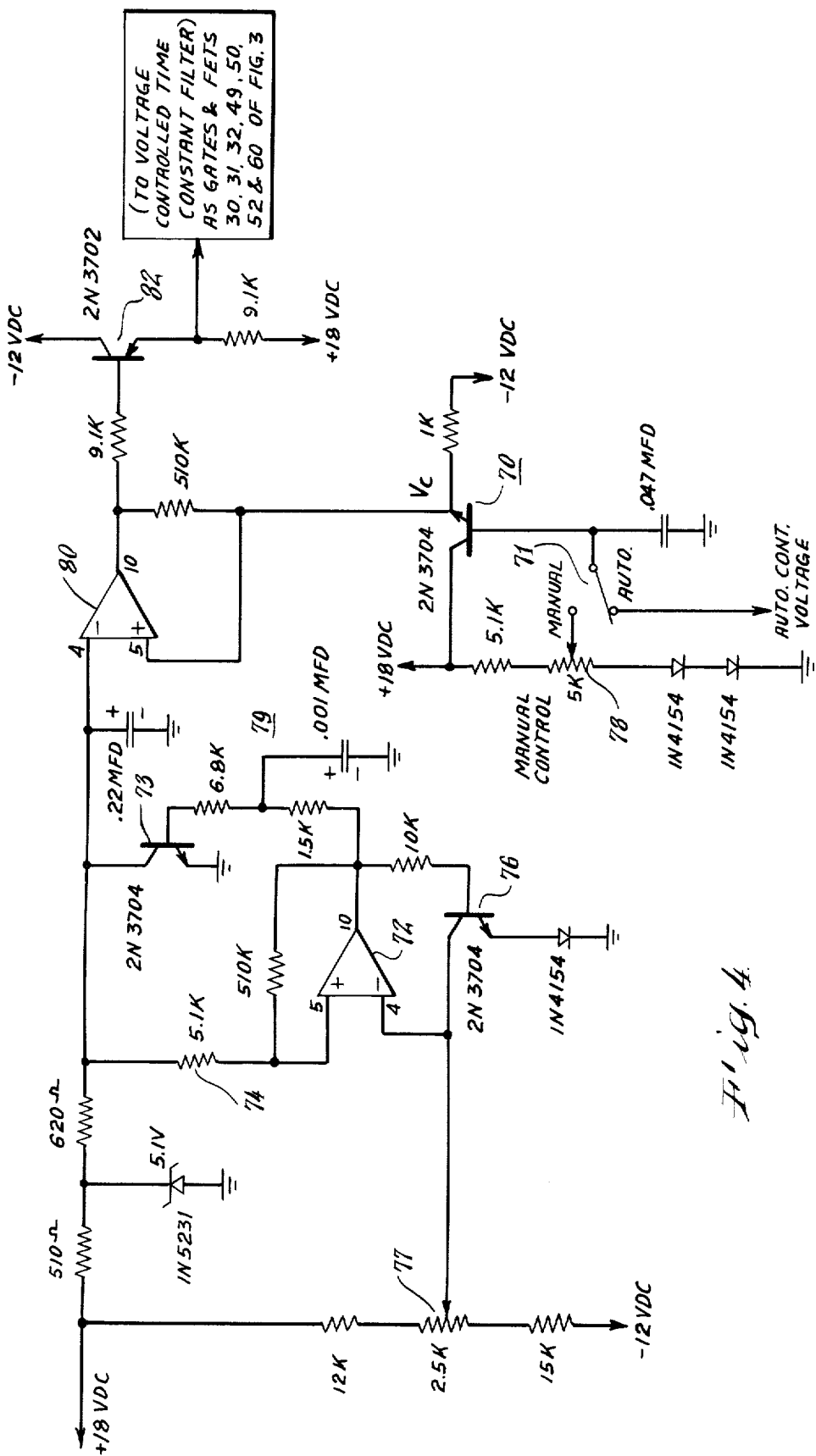
FIG. 4 is a detailed schematic circuit diagram of a modulator useful for controlling the filter of FIG. 3.

Referring to FIG. 4, there is shown a pulse width modulator circuit schematic which can be used as PWM 40 to vary the filter time constant according to the scanning rate.

Briefly, a pulse width modulator develops a train of pulses that have widths proportional to the amplitude of the modulating signal Vc.

The modulating signal Vc is derived from an emitter follower 70. Emitter follower 70 is provided for power gain and isolation. Coupled to the base electrode of the transistor emitter follower 70 is a switch 71 operative between a manual and automatic position. In the manual position, a variable DC is applied to the base and hence appears at the emitter, which voltage is used for manual variation of the filter characteristics by adjusting potentiometer 78. In the automatic position, a voltage related to the scanning rate is applied to the base and hence in this position serves to automatically vary the filter characteristics.

An operational amplifier 72 is arranged in a triangular waveform generator configuration. The operational amplifier 72 employs feedback from output to input via transistor 73, resistors 74 and 75, and the frequency selective "T" network 79. Biasing for the op AMP 72 is supplied via transistor 76 and potentiometer 77. The triangular waveform is applied to the inverting input of a second operational amplifier 80, operative as a comparator. The non-inverting input of op AMP 80 is driven by the emitter follower 70.

The comparator 80 switches states when the amplitude of the modulating signal equals the amplitude of the triangular signal. The over-all linearity of the pulse width modulated signal is a function of the linearity of the triangular reference and of the offset of the comparator, and the maximum response linearity is limited by the response of the comparator 80.

The output of comparator 80 is a pulse width modulated signal at a rate determined by the triangular waveform and of a width determined by the amplitude of the modulating signal. The rate of the triangular waveform is selected to be higher than the frequency range being scanned, as determined by the Nyquist criterion. The pulse width modulated waveform is applied to the base of output emitter follower 82 and the low impedance emitter output is used to drive the FET's as indicated.

It is, of course, understood that other filter arrangements and modulator configurations can be utilized as well without departing from the scope and extent of the invention.

By way of example, the following component values operated satisfactorily for the variable filter as shown in FIG. 3.

The components not designated by reference numerals are shown by their respective circuit values.

In summation, there has been provided a filter whose time constant is varied according to a scanning rate used to control or "sweep" the front or receiving end of a test instrument. The time constant and characteristics of the filter are thus varied as a function of the scanning rate and hence are always at the optimum values to afford optimum filtering and automatic control, thus eliminating the need for the instrument user to manually and in discrete steps vary the filter characteristics.

What is claimed is:

1. In a spectrometer of the type used for scanning an light source containing a pluality of unknown frequencies, by optically viewing and scanning said source over a predetermined range of frequencies, to develop electrical signals having frequency components related to those present in said source, and in combination, means for selectively filtering said electrical signals comprising:

a. variable low pass filter means responsive to said electrical signals, and capable of providing a plurality of different time constants related respectively to possible frequency components in said electrical signals to effectively respond to any one of said frequency components, said filter means having a control input terminal for application thereto of a control voltage signal for varying said time constant to any value included in said plurality of different time constants, b. modulating means having an input responsive to the rate of scanning and providing at an output a modulated control voltage signal manifesting a variation according to said scanning rate, and c. means coupling said modulated control voltage signal to said control input terminal of said filter means to vary said time constant according to said scanning rate.

2. The apparatus according to claim 1 wherein said modulating means is a pulse width modulator.

3. The apparatus according to claim 1 wherein said variable filter means includes at least one active semiconductor device, having an input, output and control electrode, said control electrode operative upon application of a control signal thereto to vary the impedance of said active device between said input and output

| | |
|---|---|
| FET 45 | U-233 |
| FET 30, 32, 36, 49, 50, 52, 60, 43 and 55 | 2N4222 |
| Resistors 31, 37, 42, 51, 48 and 58 | 10,000 ohms |
| Capacitors 34 | 6.1 mf. |
| 38 | 3.0 mf. |
| 57 | .69 mf. |
| 47 | 1.0 mf. |
| Parallel Diode and Capacitor | Diodes - 1N4004 |
| Circuit at FET gates | Capacitors - 220 uuf. |
| Operational AMPS 44 and 56 | 741 - Fairchild semiconductor |

The following components were used in the PWM of FIG. 4.

| | |
|---|---|
| Transistor 70, 76, 73 | 2N3704 |
| Transistor 82 | 2N3702 |
| Comparator 80 | 709 Fairchild semiconductor |
| op AMP 72 | 741 Fairchild semiconductor |
| Resistor 74 | 5100 ohms |
| Resistor 75 | 510,000 ohms | electrode, said input electrode adapted to be responsive to said electrical signals.

4. The apparatus according to claim 3 wherein said active semiconductor device is a field effect transistor.

5. In a spectrometer for determining the frequencies contained in optical signals wherein variable rate scanning means scans the optical signals at a selected rate and over a predetermined range of frequencies for isolating the frequencies contained in said range and wherein the scanned optical signals are converted into electrical signals which are filtered by filter means to separate out desired components and then further processed to identify the frequencies present in said range, and in combination:
- a variable pulse width modulator for producing pulsed electrical signals,
- means for varying the widths of the electrical pulses from the pulse width modulator in relation to changes in the scan rate of the scanning means,
- said filter means comprising a variable frequency low pass filter,
- said electrical signals being connected to said filter through on-off switch means,
- the time constant of the filter being variable in proportion to the ratio of the on to off time of said switch means as means for varying the characteristic frequency of the filter means, and
- said pulse width modulator being connected to actuate said switch means between its on and off conditions in proportion to the width of electrical pulses therefrom,
- whereby the time constant of the filter means and hence its characteristic frequency are continuously and automatically varied in relation to changes in the scan rate for maintaining an optimum characteristic frequency of the filter for the selected scan rate.

* * * * *